(12) United States Patent
Hamada

(10) Patent No.: US 6,803,628 B1
(45) Date of Patent: Oct. 12, 2004

(54) POWER SEMICONDUCTOR DEVICE AND PRODUCTION METHOD FOR THE SAME

(75) Inventor: Kimimori Hamada, Toyota (JP)

(73) Assignee: Toyota Jidosha Kabushiki Kaisha, Toyota (JP)

(*) Notice: Subject to any disclaimer, the term of this patent is extended or adjusted under 35 U.S.C. 154(b) by 0 days.

(21) Appl. No.: 09/663,340

(22) Filed: Sep. 15, 2000

(30) Foreign Application Priority Data

Sep. 17, 1999 (JP) .......................................... 11-262861

(51) Int. Cl.[7] .............................................. H01L 29/78
(52) U.S. Cl. ...................... 257/342; 257/327; 257/328; 257/329; 257/330; 257/331; 257/335; 257/341
(58) Field of Search ................................ 257/327–336, 257/341–342, 401, 491–493, 135; 438/212, 259, 270–1, 587–9

(56) References Cited

U.S. PATENT DOCUMENTS

| | | | | |
|---|---|---|---|---|
| 5,502,320 A | * | 3/1996 | Yamada | 257/302 |
| 5,648,670 A | * | 7/1997 | Blanchard | 438/270 |
| 5,986,304 A | * | 11/1999 | Hshieh et al. | 257/330 |
| 6,096,608 A | * | 8/2000 | Williams | 438/270 |
| 6,111,283 A | * | 8/2000 | Yang et al. | 257/306 |

FOREIGN PATENT DOCUMENTS

| | | |
|---|---|---|
| JP | 63-50071 | 3/1988 |
| JP | 7-235672 | 5/1995 |
| JP | 9-270512 | 10/1997 |
| JP | 10-150191 | 6/1998 |

OTHER PUBLICATIONS

M. Kato et al, "A 0.4 micrometer–squared Self–Aligned Contactless Memory Cell Technology Suitable for 256–Mbit Flash Memories", Electron Dev. Mtg. '94, Techn. Digest pp. 921–923, Dec. 11–14, 1994, San Francisco, USA (ISBN: 0–7803–2111–1).*

* cited by examiner

Primary Examiner—Nathan J. Flynn
Assistant Examiner—Johannes Mondt
(74) Attorney, Agent, or Firm—Pillsbury Winthrop LLP

(57) ABSTRACT

A power semiconductor device having a low on-resistance and a high breakdown ruggedness is disclosed. Trench regions formed so as to contact trench gates via gate-insulating films are connected by emitter regions so as to form a ladder-shaped configuration. The emitter regions are formed at a shallower depth than the trench regions. Therefore, the resistance in portions of the body that are near the interfaces with the emitter regions is reduced, and the operation of parasitic transistors formed by the emitter regions, the body, and an epitaxial layer is substantially prevented. As a result, the on-resistance is varied, and the avalanche ruggedness and the latch-up ruggedness are improved.

6 Claims, 3 Drawing Sheets

POWER SEMICONDUCTOR DEVICE AND PRODUCTION METHOD FOR THE SAME

INCORPORATION BY REFERENCE

The disclosure of Japanese Patent Application No. HEI 11-262861 filed on Sep. 17, 1999 including the specification, drawings and abstract is incorporated herein by reference in its entirety.

BACKGROUND OF THE INVENTION

1. Field of the Invention

The invention relates to a power semiconductor device and a production method for the power semiconductor device and, more particularly, to a power semiconductor device having a plurality of linear trench gates that extend substantially parallel to one another and extend through a body region formed on a semiconductor substrate, from an obverse surface side of the body region.

2. Description of the Related Art

As a power semiconductor device, an insulated gate bipolar transistor (IGBT) in which N-type emitters formed in contact with trench gates are connected by N-type semiconductor regions so as to form a ladder-shaped configuration has been proposed (e.g., in Japanese Patent Application Laid-Open No. HEI 9-270512). In this device, the emitter-contact width is reduced by forming ladder-shaped N-type semiconductor regions. In this device, the N-type emitters and the N-type semiconductor regions are formed by a single diffusion layer, and therefore, their depths are substantially equal.

In power semiconductor devices, both low on-resistance and high breakdown ruggedness are demanded.

SUMMARY OF THE INVENTION

Accordingly, it is an object of the invention to provide a power semiconductor device with low on-resistance and high breakdown ruggedness.

An insulated gate type semiconductor device according to the invention includes a body region of a first conductivity type formed in a semiconductor substrate, a plurality of trench gates extending through the body region, and a plurality of first semiconductor regions of a second conductivity type that is different from the first conductivity type. The first semiconductor regions have a first depth as measured from a surface of the body region and sandwich the trench gates via the gate-insulating films. The semiconductor device also includes a plurality of second semiconductor regions of the second conductivity type having a second depth as measured from the surface of the body region that is less than the first depth. The second semiconductor regions connect the plurality of first semiconductor regions spaced apart from one another.

According to the above-described aspect, since the second semiconductor regions are formed to have less depth than the first semiconductor regions, the impurity concentration in a portion of the body region near the second semiconductor region can be increased, in comparison with a case where the first and second semiconductor regions have substantially equal depths. Therefore, the resistance in the portion of the body region near the second semiconductor region is decreased, so that the on-resistance of the semiconductor device can be reduced and the breakdown ruggedness thereof can be improved.

BRIEF DESCRIPTION OF THE DRAWINGS

The foregoing and further objects, features and advantages of the invention will become apparent from the following description of a preferred embodiment with reference to the accompanying drawings, wherein like numerals are used to represent like elements and wherein.

DETAILED DESCRIPTION OF PREFERRED EMBODIMENT

A preferred embodiment of the invention will be described hereinafter with reference to the accompanying drawings.

Figure 1:
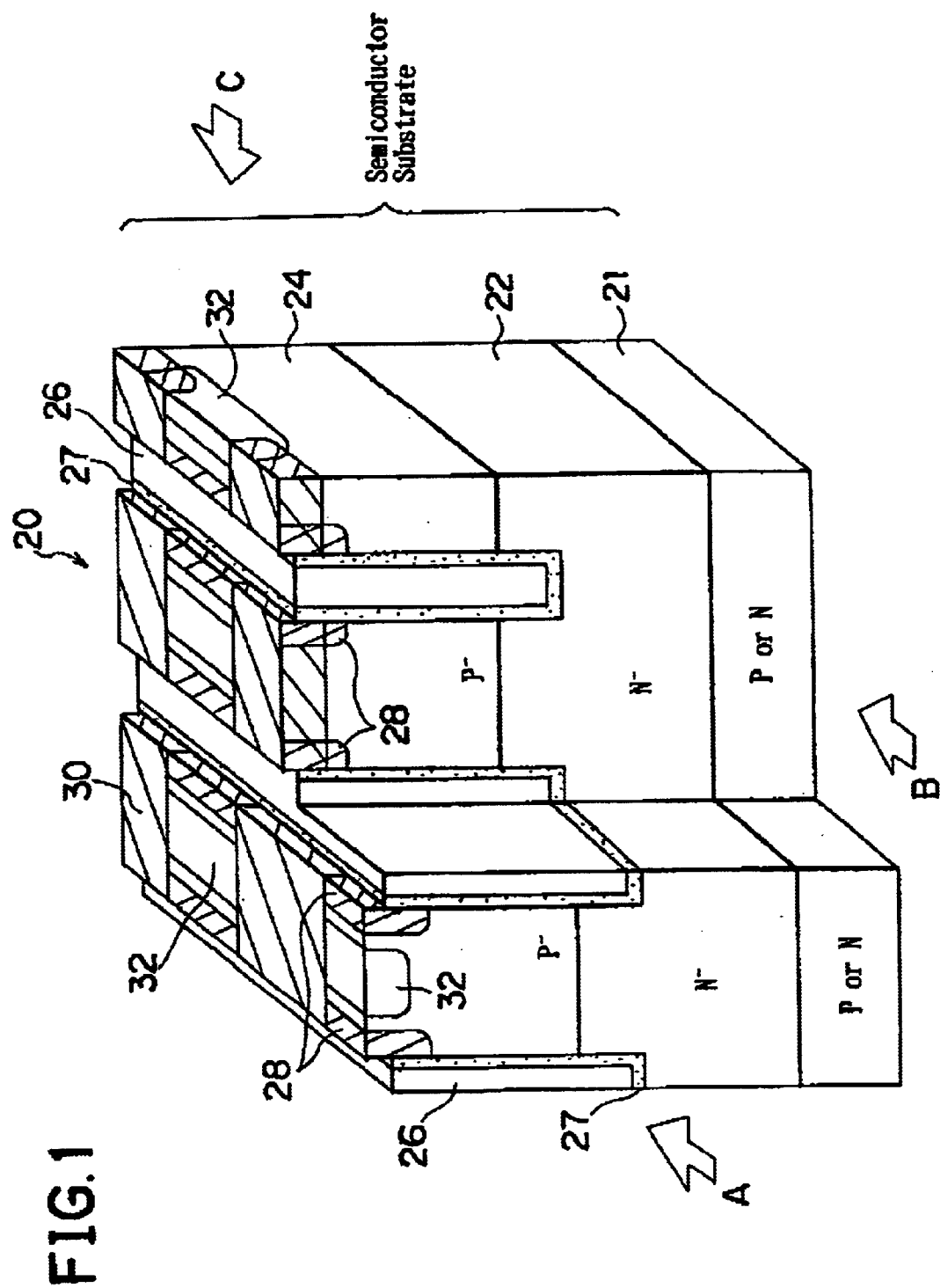
FIG. 1 is a schematic illustration of a power semiconductor device according to an embodiment of the invention.
Figure 2:
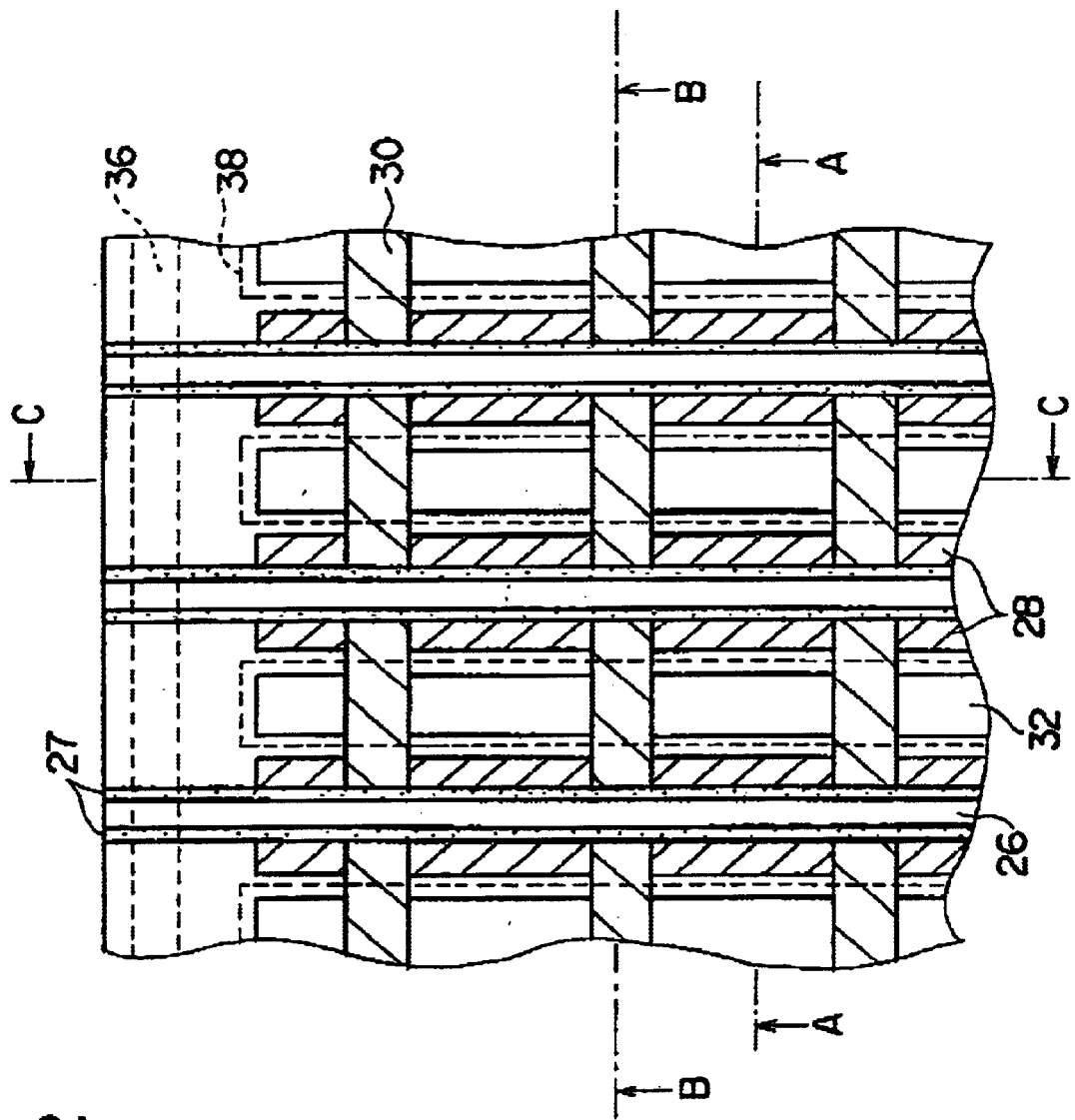
FIG. 2 is a schematic plan view illustrating a construction of the power semiconductor device of the invention.

FIG. 1 is a schematic diagram illustrating a construction of a power semiconductor device 20 according to an embodiment of the invention. FIG. 2 is a schematic illustration of a construction of the power semiconductor device 20 viewed from a surface thereof. A construction on section A—A indicated in FIG. 2 corresponds to a leftward front face of the illustration of FIG. 1 (see an arrow A in FIG. 1). A construction taken on section B—B indicated in FIG. 2 corresponds to a rightward front face of the illustration of FIG. 1 (see an arrow B in FIG. 1). A construction taken on section C—C indicated in FIG. 2 corresponds to a right side face of the illustration of FIG. 1 (see an arrow C in FIG. 1).

The power semiconductor device 20 of this embodiment, as shown in the drawings, has a body 24 of a P-type semiconductor region formed on a surface of an N-type epitaxial layer 22 that is formed on a substrate 21 formed by a P-type or N-type semiconductor. A plurality of trench gates 26 are disposed parallel to one another and extend from an obverse surface, which in FIG. 1 is the top surface, of a semiconductor substrate through the body 24 to the epitaxial layer 22. Formed on opposite sides of each trench gate 26 are emitter regions that are $N^+$-type semiconductor regions contacting the trench gate 26 via a gate-insulating film 27, such as a silicon oxide film or the like. In this embodiment, the emitter regions are formed by trench-emitter regions 28 (a first semiconductor region) and emitter-connecting regions 30 (a second semiconductor region). The emitter-connecting regions 30 connect trench-emitter regions 28 that face each other so as to form a ladder-shaped configuration. The power semiconductor device 20 further has contact P regions 32 that are $P^+$-type semiconductor regions formed between the emitter-connecting regions 30 on the body 24. The power semiconductor device 20 may be a power MOSFET (where the substrate 21 is of N-type), an insulated gate bipolar transistor (IGBT, where the substrate 21 is of P-type) which is a generally-termed vertical-type device wherein a main current flows in a vertical direction with respect to the substrate, or a composite device that partially has a construction of a device mentioned above. FIGS. 1 and 2 show design pattern for the power semiconductor device 20. The contact P region 32 and the trench-emitter regions 28 can be formed by thermal diffusion. Therefore, in a practical manner, a part of the contact P region 32 and a part of the trench-emitter regions 28 may overlap each other.

As shown in FIG. 1, each trench gate 26 is formed so as to extend from the obverse surface into the interior of the semiconductor substrate, that is, so as to form an indentation. Furthermore, as shown in FIG. 2, the trench gates 26 are connected at end portions thereof to a gate voltageapplying circuit conductor 36 (see an upper portion of FIG. 2). Upper ends of the trench gate 26 are preferably flush with the obverse surface of the semiconductor substrate. In many actual cases, however, the ends of the trench gates 26 are disposed several tenths of 1 μm below the obverse surface of the semiconductor substrate in order to achieve process consistency. Considering this, this embodiment has a construction wherein the upper ends of the trench gates 26 are lower than the obverse surface of the semiconductor substrate.

The $N^+$ trench-emitter regions 28 are formed deeper than the upper ends of the trench gates 26 so that a portion of each $N^+$ trench-emitter region 28 contacts the trench gate 26 via the gate-insulating film 27, such as a silicon oxide film or the like. For example, if the upper ends of the trench gates 26 are several tenths of 1 μm lower than the obverse surface of the semiconductor substrate, it is preferable that the $N^+$ trench-emitter regions 28 be formed to have a depth of about 1 μm.

The $N^+$ emitter-connecting regions 30 are formed to have a less depth than the $N^+$ trench-emitter regions 28. As shown in FIG. 2, a portion of the surface of each $N^+$ emitter-connecting region 30 is covered, together with a surface of the adjacent contact P region 32, with a circuit conductor 38. The $N^+$ emitter-connecting regions 30 are formed in order to electrically connect the $N^+$ trench-emitter regions 28 and the circuit conductors 38. Therefore, it is required that the $N^+$ emitter-connecting regions 30 have a low resistance value and such an impurity concentration that the contact resistance with respect to the circuit conductors 38 can be sufficiently reduced.

Figure 3:
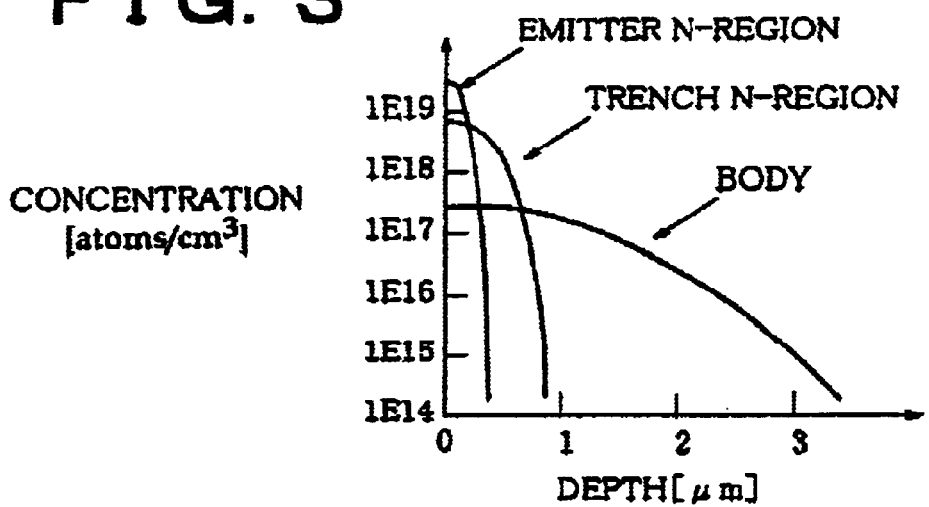
FIG. 3 is a graph indicating relationships between depths of a body, a trench-emitter region and an emitter-connecting region from their surfaces and impurity concentrations.
Figure 4A:
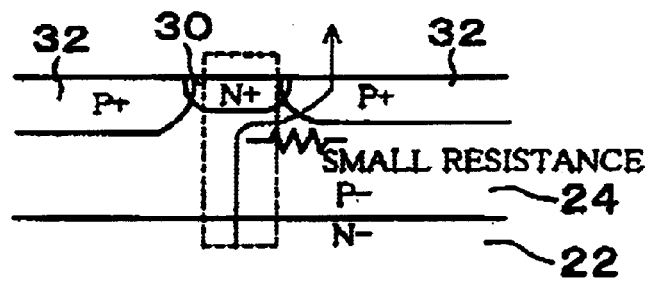
FIG. 4A illustrates the flow of current occurring where an emitter-connecting region is relatively shallow.
Figure 4B:
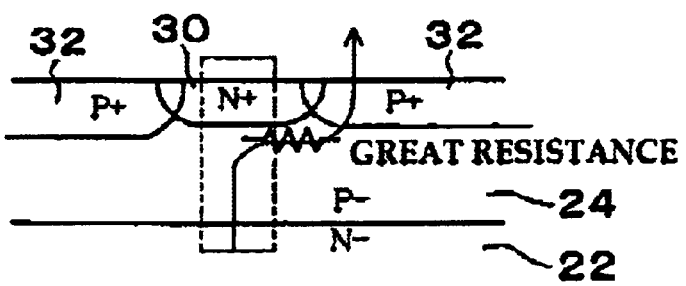
FIG. 4B illustrates the flow of current occurring where an emitter-connecting region is relatively deep.

Characteristics of the above-described power semiconductor device 20 of the embodiment will be described. FIG. 3 is a graph indicating relationships between depths of the body 24, the $N^+$ trench-emitter regions 28 and the $N^+$ emitter-connecting regions 30 measured from their surfaces and impurity concentrations therein. Typically, the body 24, the $N^+$ trench-emitter regions 28 and the $N^+$ emitter-connecting regions 30 are formed by thermal diffusion of impurities from the obverse surface side of the semiconductor substrate. Therefore, with increases in the depth from the surface of the semiconductor substrate, the impurity concentration decreases (the diffusion becomes more difficult). That is, the deeper the $N^+$ emitter-connecting regions 30, the lower the impurity concentration in portions of the body 24 near lower portions of the $N^+$ emitter-connecting regions 30. The resistance of the body 24 increases with decreases in the impurity concentration therein. Therefore, the resistance of portions of the body 24 near lower portions of the $N^+$ emitter-connecting regions 30 increases as the depth of the $N^+$ emitter-connecting regions 30 is increased. FIGS. 4A and 4B exemplify the flow of current occurring if the $N^+$ emitter-connecting regions 30 are relatively shallow, and the flow of current occurring if the $N^+$ emitter-connecting regions 30 are relatively deep. In FIGS. 4A and 4B, portions indicated by broken lines represent parasitic NPN transistors present in the devices. Now considered will be a case where current flows from the epitaxial layer 22 through a vicinity of a lower portion of an $N^+$ emitter-connecting region 30 into a contact P region 32 as indicated by an arrow in each diagram. The resistance of the vicinity of the lower portion of the $N^+$ emitter-connecting region 30 increases as the depth of the $N^+$ emitter-connecting region 30 is increased. Therefore, the electric potential that occurs in the vicinity of the lower portion of the $N^+$ emitter-connecting region 30 also increases when the depth of the $N^+$ emitter-connecting region 30 is increased. If such an electric potential occurs, it may happen that a forward bias is applied to the base of the parasitic NPN transistor (that is, the parasitic NPN transistor operates) so that the power semiconductor device 20 breaks. In contrast, if the $N^+$ emitter-connecting region 30 is relatively shallow, the resistance of the vicinity of the lower portion of the $N^+$ emitter-connecting region 30 is reduced so as to substantially avoid the aforementioned operation of the parasitic NPN transistor. Therefore, avalanche breakdown ruggedness and latch-up ruggedness (that is, the level of withstanding excessive current) are improved.

In the above-described power semiconductor device 20 of the embodiment, by reducing the depth of the $N^+$ emitter regions 30, the avalanche ruggedness and the latch-up ruggedness can be improved with controlling the on-resistance.

Although in the power semiconductor device 20 of the embodiment, the body 24 is formed as a P-type semiconductor region, it is also possible to form the body 24 as an N-type semiconductor region and form the epitaxial layer 22, the $N^+$ trench-emitter regions 28, the $N^+$ emitter-connecting regions 30 and the $P^+$ contact region 32 by semiconductor regions of different conduction types.

While the invention has been described with reference to what is presently considered to be a preferred embodiment thereof, it is to be understood that the invention is not limited to the disclosed embodiment or constructions. On the contrary, the invention is intended to cover various modifications and equivalent arrangements without departing from the gist of the invention.

What is claimed is:

1. A semiconductor device comprising:
   a body region of a first conductivity type formed in a semiconductor substrate and having a major surface opposite to a surface shared between the semiconductor substrate and the body region;
   a plurality of trench gates extending through the body region;
   a plurality of first semiconductor regions of a second conductivity type that is different from the first conductivity type, the first semiconductor regions having a first depth as measured from said major surface of the body region, at least a portion of the first semiconductor regions flanking the trench gates on both of their sides and being in contact with said trench gates via films bordering and insulating the trench gates;
   a plurality of second semiconductor regions of the second conductivity type having a second depth as measured from said major surface of the body region that is less than the first depth; and
   a plurality of noncontiguous third semiconductor regions of the first conductivity type whose major extension is in a direction parallel to both the major surface of the body region and the trench gates;
   wherein the body region is exposed between the plurality of second semiconductor regions and the second semiconductor regions connect the plurality of first semiconductor regions spaced apart from one another.

2. A semiconductor device according to claim 1, wherein the first semiconductor regions are formed along the trench gates and the second semiconductor regions connect the first semiconductor regions formed between the trench gates so as to form a ladder-shaped configuration.

3. A semiconductor device according to claim 1, further comprising a wiring member connected to at least one of the plurality of trench gates.

4. A semiconductor device according to claim 2, further comprising a wiring member connected to at least one of the plurality of trench gates.

5. A semiconductor device according to claim 1, further comprising a wiring member connected to the body region and to the second semiconductor region.

6. A semiconductor device according to claim 2, further comprising a wiring member connected to the body region and to the second semiconductor region.

* * * * *